(12) United States Patent  
Kuo et al.

(10) Patent No.: US 7,734,000 B2  
(45) Date of Patent: Jun. 8, 2010

(54) CLOCK AND DATA RECOVERY CIRCUITS

(75) Inventors: Chun-Cheng Kuo, Taipei (TW); Li-Ren Huang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 1344 days.

(21) Appl. No.: 11/118,323

(22) Filed: May 2, 2005

(65) Prior Publication Data

US 2006/0140309 A1 Jun. 29, 2006

(30) Foreign Application Priority Data

Dec. 28, 2004 (TW) .............................. 93140979 A

(51) Int. Cl.  
*H03D 3/24* (2006.01)

(52) U.S. Cl. .................. 375/375; 375/360; 375/371

(58) Field of Classification Search .................. 331/17; 375/354, 360–362, 371, 373, 375–376; 713/500, 713/50  
See application file for complete search history.

(56) References Cited

U.S. PATENT DOCUMENTS

| | | | |
|---|---|---|---|
| 5,237,290 A | 8/1993 | Banu et al. | |
| 5,418,496 A | 5/1995 | Ford et al. | |
| 5,757,872 A | 5/1998 | Banu et al. | |
| 5,834,980 A * | 11/1998 | Pitio et al. | ..................... 331/2 |
| 6,211,741 B1 * | 4/2001 | Dalmia | ........................ 331/11 |
| 6,259,326 B1 | 7/2001 | Dunlop et al. | |
| 6,650,190 B2 * | 11/2003 | Jordan et al. | ................... 331/57 |
| 2004/0046596 A1 | 3/2004 | Kaeriyama et al. | |
| 2005/0123085 A1 * | 6/2005 | Skog et al. | .................. 375/354 |
| 2005/0218999 A1 * | 10/2005 | Jasa et al. | ..................... 331/16 |
| 2006/0136770 A1 * | 6/2006 | Jorgenson et al. | ........... 713/500 |

* cited by examiner

*Primary Examiner*—Shuwang Liu  
*Assistant Examiner*—James M Perez  
(74) *Attorney, Agent, or Firm*—Birch, Stewart, Kolasch & Birch, LLP

(57) ABSTRACT

A clock and data recovery circuit comprising a phase detection circuit, first and second oscillators, and a flip-flop. The phase detection circuit outputs a detection signal according to a significant transition of an input signal. Each oscillator receives the detection signal and operates alternately in a clock and data recovery mode and a phase-locked mode. When the first oscillator operates in the clock and data recovery mode and outputs a first clock to control the flip-flop to output an output signal, the second oscillator operates in the phase-locked mode to adjust a frequency of a second clock. Before switching to the clock and data recovery mode, the second oscillator synchronizes the second clock with the first clock.

24 Claims, 5 Drawing Sheets

CLOCK AND DATA RECOVERY CIRCUITS

BACKGROUND

The invention relates to a clock and data recovery circuit, and in particular to a clock and data recovery circuit employed in communication systems.

In a typical communication system, a transmitter generates data signals according to its clock and transmits the data signals to a receiver through channels. To correctly interpret the data signals, the receiver reads the data signals according to a clock synchronized with the transmitter's clock. The receiver thus requires a clock recovery system to recover the data signal from the transmitter. At least two clock recovery techniques are currently used. First, the transmitter's clock may be transmitted to the receiver on a channel parallel with the channel carrying the data signals. The receiver can then estimate the phase of the data signals from the phase of transmitter's clock. This technique however, is disadvantageous in that it requires an additional channel. Alternately, the phase of the data signals may be recovered directly from information carried in the data signals themselves.

FIG. 1 shows a conventional clock and data recovery circuit. The clock and data recovery circuit 1 comprises a control unit 10, a gated voltage controlled oscillator (GVCO) 11, a D flip-flop 12, and a phase locked loop (PLL) 13. The PLL 13 comprises a phase/frequency detector 130, a charge pump 131, a filter 132, and a GVCO 133. The control unit 10 controls the GVCO 11 to receive a data signal D1. The phase/frequency detector 130 of the PLL 13 receives a reference clock Cf1, and the filter 132 controls the GVCOs 11 and 133. The GVCOs 11 and 133 respectively output oscillated clocks CK1 and CK2 corresponding to the data signal D1. The D flip-flop 12 reads the data signal D1 according to the clock CK1, thus estimating the phase of the data signal D1 correctly.

In ideal conditions, the clock CK1 synchronizes with the clock CK2. However, since the processes of the GVCOs 11 and 133 may not match, difference between the phases of the locks CK1 and CK2 is increased with time, such that the D flip-flop 12 may incorrectly trigger the data signal D1.

SUMMARY

Clock and data recovery circuits are provided. An exemplary embodiment of a clock and data recovery circuit comprises a phase detection circuit, a first oscillator, a second oscillator, and a flip-flop. The clock and data recovery circuit receives an input signal and outputs an output signal in phase with the input signal. The phase detection circuit estimates a significant transition of the input signal and outputs a first detection signal. The first oscillator receives the first detection signal and outputs a first clock. The first oscillator operates in a first mode during a first period and operates sequentially in second and synchronization modes during a second period. The second oscillator receives the first detection signal and outputs a second clock. The second oscillator operates sequentially in the second and synchronization modes during the first period and in the first mode during the second period. The flip-flop receives the input signal and outputs the output signal according to the first and second clocks respectively during the first and second periods.

An exemplary embodiment of a clock and data recovery circuit comprises a phase detection circuit, a first oscillator, a second oscillator, and a flip-flop. The clock and data recovery circuit receives an input signal and outputs an output signal in phase with the input signal. The phase detection circuit estimates a significant transition of the input signal and outputs a detection signal. Each oscillator receives the detection signal and operates alternately in a clock and data recovery mode and a phase-locked mode. The first and second oscillators respectively output first and second clocks. The flip-flop receives the input terminal and outputs the output signal according to the first or second clock. During a first period, the first oscillator operates in the clock and data recovery mode and outputs the first clock to control the flip-flop to output the output signal, and the second oscillator operates in the phase-locked mode to adjust a frequency of the second clock. During the first period, before switching to the clock and data recovery mode, the second oscillator synchronizes the second clock with the first clock.

DESCRIPTION OF THE DRAWINGS

The invention will become more fully understood from the detailed description given hereinbelow and the accompanying drawings, given by way of illustration only and thus not intended to be limitative of the invention.

DETAILED DESCRIPTION

Figure 1:
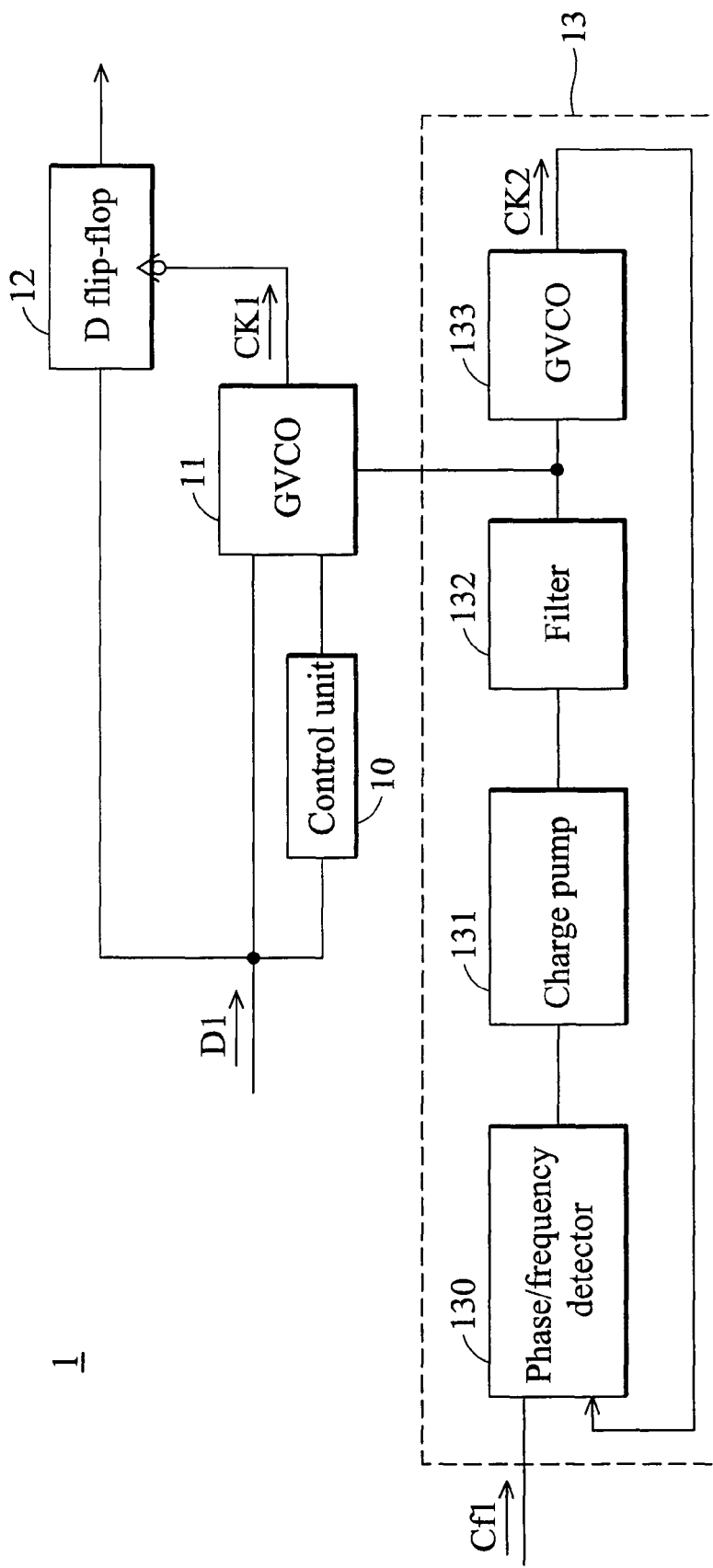
FIG. 1 shows a conventional clock and data recovery circuit.
Figure 2:
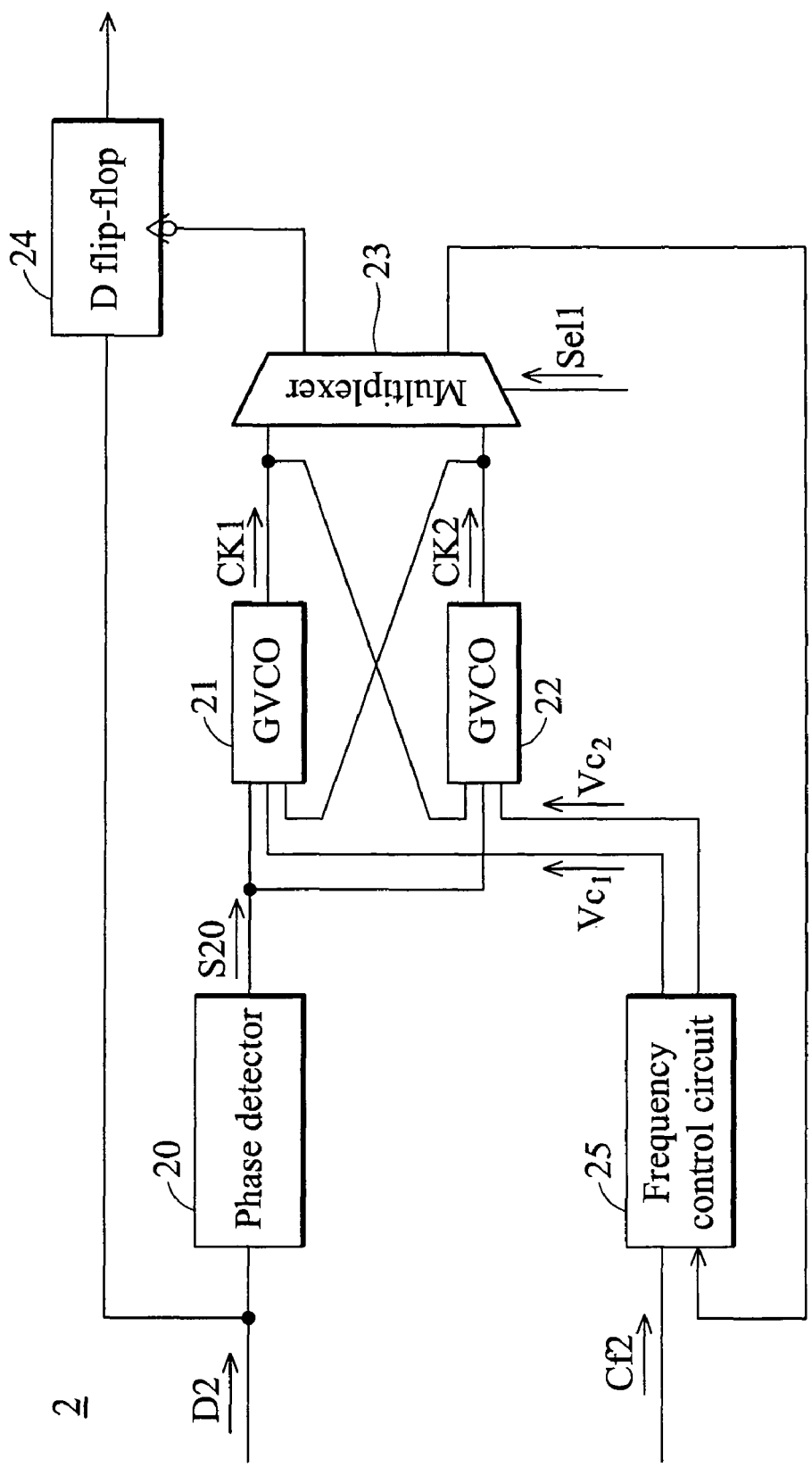
FIG. 2 is a block diagram of an embodiment of a clock and data recovery circuit.

Clock and data recovery circuits are provided. In an exemplary embodiment of a clock and data recovery circuit, as shown in FIG. 2, a clock and data recovery circuit 2 receives a data signal D2 from a transmitter (not shown) as its input signal and generates an output signal equal to the input signal. The clock and data recovery circuit 2 comprises a phase detector 20, gated voltage controlled oscillators (GVCO) 21 and 22, a multiplexer 23, a D flip-flop 24, and a frequency control circuit 25. The phase detector 20 and the D flip-flop 24 receive the data signal D2, and the frequency control circuit 25 receives a reference clock Cf2.

The phase detector 20 outputs a detection signal S20 to the GVCOs 21 and 22 according to the significant transition (rising or falling edges) of the data signal D2. The GVCOs 21 and 22 output clocks CK1 and CK2 according to the detection signal S20 respectively to two input terminals of the multiplexer 23.

Both GVCOs 21 and 22 alternately operate in data/clock recovery mode (first mode) and phase-locked mode (second mode) and respectively output the clocks CK1 and CK2. The GVCOs 21 and 22 operate the different modes at the same time. Before switching to the first mode from the second mode, each GVCO operates in synchronization mode (third mode).

After each GVCO, such as GVCO 21, operates the first mode M1 for a period, the frequency of the clock CK1 may shift due to leakage current of capacitors therein. In the subsequent second mode, the shifted frequency of the clock CK1 can be adjusted to within a predetermined error range. Before the GVCO 21 switches to the first mode from the second mode, the GVCO 21 operates in the third mode to synchronize the clock CK1 with the clock CK2 from the GVCO 22, thereby avoiding erroneous detection of phase of the data signal D2 due to the different between the phases of the clocks CK1 and CK2. The GVCOs 21 and 22 operate alternately, such that the frequency error caused by unmatched elements can be compensated for.

Figure 3:
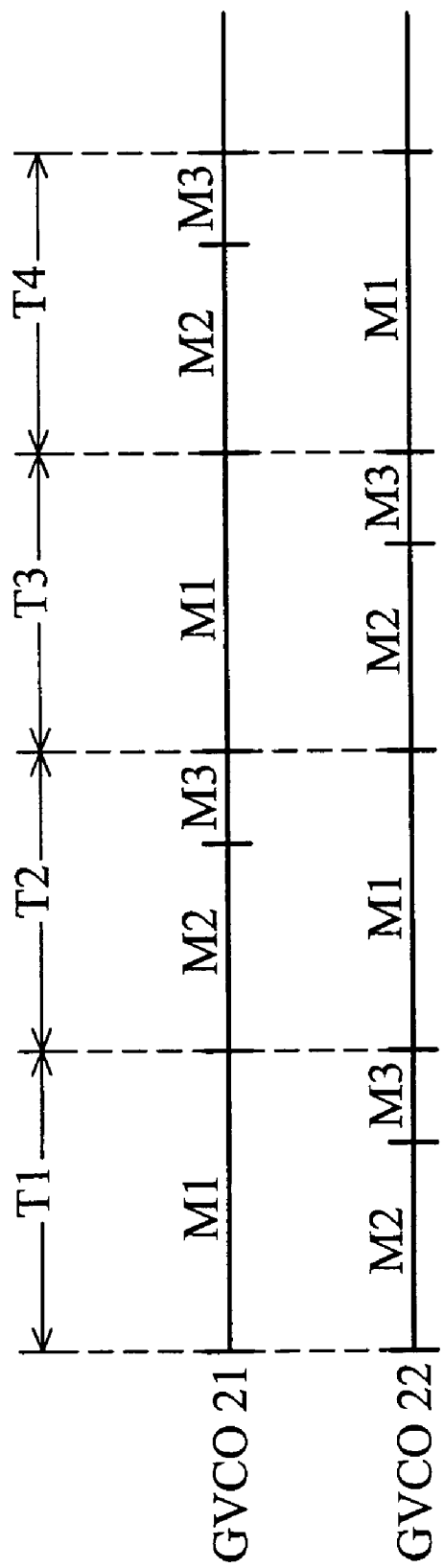
FIG. 3 depicts an embodiment of operating modes of the GVCOs in FIG. 2.

Referring to FIGS. 2 and 3, during a period T1, the GVCO 21 operates in a first mode M1, while the GVCO 22 operates in a second mode M2. Since the GVCO 21 operates in the first mode M1, the multiplexer 23 selects the clock CLK1 to output to a control terminal of the D flip-flop 24 according to a select signal Sel1. The D flip-flop 24 triggers the data signal D2 according to the clock CK1 and outputs the recovered data signal as the output signal. Since the GVCO 22 operates in the second mode M2, the multiplexer 23 selects the clock CK2 to output to the frequency control circuit 25 according to the select signal Sel1. The frequency control circuit 25 outputs a control voltage $Vc_2$ to the GVCO 22 according to the difference between the reference clock Cf2 and the clock CK2, and the GVCO 22 thus adjusts the frequency of the clock CK2 to be the same as that of the data signal D2 or in the predetermined error range. The GVCO 22 then operates in a third mode M3. The GVCO 22 receives the clock CK1 from the GVCO 21 and synchronizes the clock CK2 with the clock CK1.

During a subsequent period T2, the GVCO 21 operates in the second mode M2, while the GVCO 22 operates in a first mode M1. Since the GVCO 21 operates in the second mode M2, the multiplexer 23 selects the clock CK1 to output to the frequency control circuit 25 according to the select signal Sel1. The frequency control circuit 25 outputs a control voltage $Vc_1$ to the GVCO 21 according to the difference between the reference clock Cf2 and the clock CK1, and the GVCO 21 thus adjusts the frequency of the clock CK1 to be the same as that of the data signal D2 or in the predetermined error range. The GVCO 21 then operates in the third mode M3. The GVCO 21 receives the clock CK2 from the GVCO 22 and synchronizes the clock CK1 therewith. Since the GVCO 22 operates in the first mode M1, the multiplexer 23 selects the clock CLK2 to output to the control terminal of the D flip-flop 24 according to the select signal Sel1. The D flip-flop 24 triggers the phase of the data signal D2 according to the clock CK2 and outputs the recovered data signal as the output signal.

During a period T3 following the period T2, the GVCOs 21 and 22 operate in the respective modes of the period T1. During a period T4 following the period T3, the GVCOs 21 and 22 operate in the respective modes of the period T2. The GVCOs 21 and 22 operate the respective modes of the periods T1 and T2 repeatedly.

As previously described, each GVCO operates in first and second modes alternately. Before switching to the first mode from the second mode, the GVCO operates in a third mode. In other words, each GVCO operates in first, second, third modes sequentially.

Figure 4:
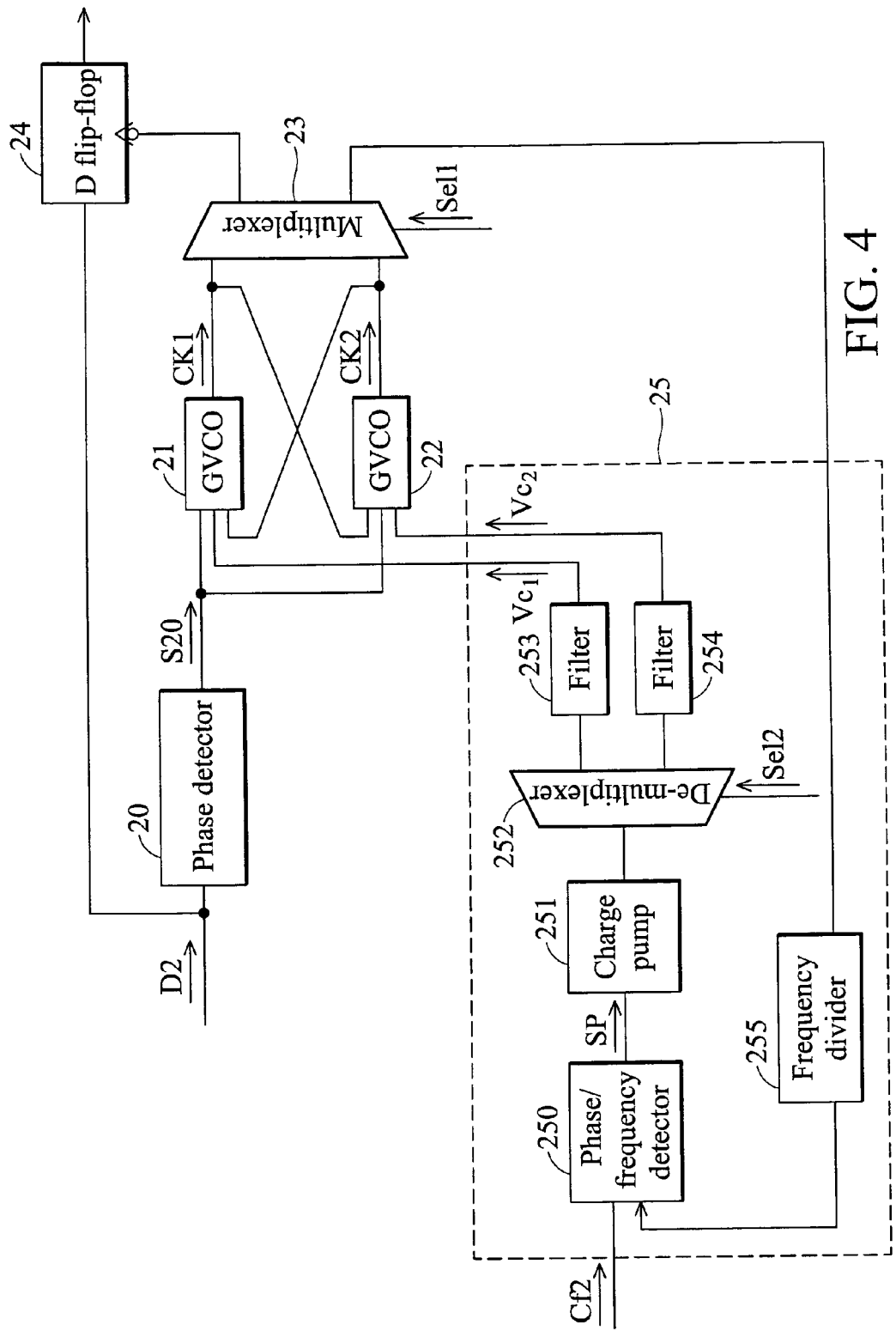
FIG. 4 is a block diagram of an embodiment of a frequency control circuit.

Frequency control circuits are provided. An exemplary embodiment of a frequency control circuit 25, as shown in FIG. 4, comprises a phase/frequency detector 250, a charge pump 251, a de-multiplexer 252, filters 253 and 254, and a frequency divider 255. The filters 253 and 254 can be low pass filters, and provide the voltages $Vc_1$ and $Vc_2$ respectively. The frequency divider 255 divides the frequency of the clock generated by the GVCO operating in the second mode M2. The divided clock is transmitted to one input terminal of the phase/frequency detector 250. The other input terminal of the phase/frequency detector 250 receives the reference clock Cf2.

During the periods T1 and T3, since the GVCO 22 operates in the second mode M2, the frequency divider 255 divides the frequency of the clock CK2 output from the GVCO 22. The divided clock CK2 is transmitted to the phase/frequency detector 250. The phase/frequency detector 250 outputs a control signal SP to the charge pump 251 according to the difference between the reference clock Cf2 and the clock CK2. The de-multiplexer 252 turns on the path between the charge pump 251 and the filter 254 according a select signal Sel2 to connect the charge pump 251 to the filter 254. The charge pump 251 varies the control voltage $Vc_2$ according to the control signal SP. Thus, the GVCO 22 adjusts the frequency of the clock CK2 generated by itself according to the control voltage $Vc_2$. In other words, during the periods T1 and T3, the operation of the phase/frequency detector 250, the charge pump 251, the de-multiplexer 252, the filter 254, and the frequency divider 255 is same as the operation of a conventional PLL circuit.

During the periods T2 and T4, since the GVCO 21 operates in the second mode M2, the frequency divider 255 divides the frequency of the clock CK1 output from the GVCO 21. The divided clock CK1 is transmitted to the phase/frequency detector 250. The phase/frequency detector 250 outputs the control signal SP to the charge pump 251 according to the difference between the reference clock Cf2 and the clock CK1. The de-multiplexer 252 turns on the path between the charge pump 251 and the filter 253 according to the select signal Sel2 to couple the charge pump 251 to the filter 254. The charge pump 251 varies the control voltage $Vc_1$ according to the control signal SP. Thus, the GVCO 21 adjusts the frequency of the clock CK1 generated by itself according to the control voltage $Vc_1$. In other words, during the periods T2 and T4, operation of the phase/frequency detector 250, the charge pump 251, the de-multiplexer 252, the filter 253, and the frequency divider 255 is same as the operation of a conventional PLL circuit.

Figure 5:
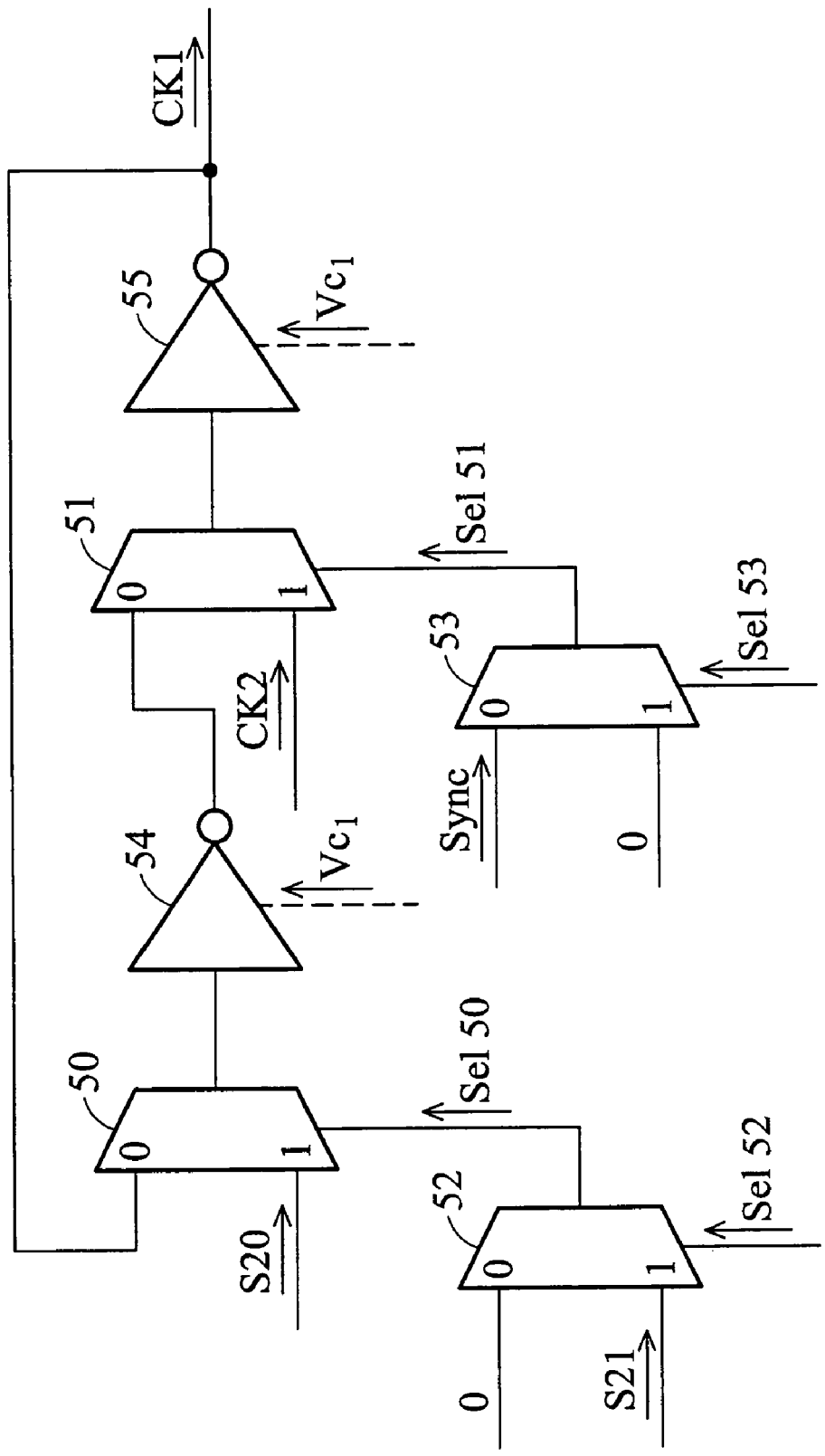
FIG. 5 is a block diagram of an embodiment of a GVCO.

GVCOs are provided. In an exemplary embodiment of a GVCO, as shown in FIG. 5, for example, the GVCO 21 comprises multiplexers 50 to 53 and two delay units. In the embodiment in FIG. 5, the delay units are implemented by inverters 54 and 55. The phase detector 20 further outputs a detection signal S21 according to the significant transition of the data signal D2, and the detection signal S21 is delayed from the detection signal S20, for example, the detection signal S21 can be delayed from the detection signal S20 for ½ unit time. Referring to FIG. 5, two input terminals of the multiplexer 50 respectively receive clock CK1 and the detection signal S20 and the multiplexer 50 is controlled by a select signal Sel50. An input terminal of the inverter 54 is coupled to an output terminal of the multiplexer 50. One input terminal of the multiplexer 51 is coupled to an output terminal of the inverter 54, and the other input terminal thereof receives the clock CK2 from GVCO 22. The multiplexer 51 is controlled by a select signal Sel51. An input terminal of the inverter 55 is coupled to an output terminal of the multiplexer 51, and an output terminal thereof outputs the clock CK1.

Two input terminals of the multiplexer 52 respectively receive a low voltage level (digital logic "0") signal and the detection signal S21. The multiplexer 52 is controlled by a select signal Sel52 and outputs the select signal Sel50. Two input terminals of the multiplexer 53 respectively receive a synchronizing signal Sync and a low voltage level (for example digital logic "0" in this embodiment). The multiplexer 53 is controlled by a select signal Sel53 and outputs the select signal Sel51.

During the period T1, the GVCO 21 operates in a first mode M1. The select signal Sel52 is at a high voltage level (for example digital logic "1" in this embodiment), so that the multiplexer 52 selects the detection signal S21 as the select signal Sel50. The select signal Sel53 is at the high voltage level ("1"), so that the multiplexer 53 selects the low voltage level ("0") signal as the select signal Sel51. The multiplexer 50 selects the detection signal S20 to the input terminal of the inverter 54 according to the select signal Sel50 at the high voltage level ("1") or selects the clock CK1 to output to the input terminal of the inverter 54 according to the select signal Sel50 at the low voltage level ("0"). The multiplexer 51 selects the signal from the output terminal of the inverter 54 to the input terminal of the inverter 55 according the select signal Sel51 at the low voltage level ("0"). The inverter 55 outputs the clock CK1.

During the period T2, the GVCO 21 operates in the second mode M2 first and then in the third mode. When the GVCO 21 operates in the second mode, the select signals Sel52, Sel53 and the synchronizing signal Sync are at low voltage level ("0"). The multiplexer 52 selects the low voltage level ("0") signal as the select signal Sel50, and the multiplexer 53 selects the synchronizing signal Sync as the select signal Sel51. The multiplexer 50 selects the clock CK1 to output to the input terminal of the inverter 54 according to the select signal Sel50 at the low voltage level ("0"). The multiplexer 51 selects the signal from the inverter 54 to output to the input terminal of the inverter 55 according the select signal Sel51 at the low voltage level ("0"). The inverter 55 outputs the clock CK1. When the GVCO 21 operates in the second mode M2, the frequency control circuit 25 controls the operation frequency of the inverters 54 and 55 by the control voltage $Vc_1$ to adjust the frequency of the clock CK1.

When the GVCO 21 operates in the third mode during the period T2, the select signals Sel52 and Sel53 are at the low voltage level, and the synchronizing signal Sync is at high voltage level ("1"). The multiplexer 52 selects the low voltage level ("0") signal as the select signal Sel50, and the multiplexer 53 selects the synchronizing signal Sync as the select signal Sel51. The multiplexer 50 selects the clock CK1 to output to the input terminal of the inverter 54 according to the select signal Sel50 at the low voltage level ("0"). The multiplexer 51 selects the clock CK2 to output to the input terminal of the inverter 55 according to the select signal Sel51 at the high voltage level ("1"). The inverter 55 outputs the clock CK1, which has been synchronized with the clock CK2.

Similarly, the GVCO 22 has the same circuit as FIG. 5. In the GVCO 22, the multiplexer 50 receives the clock CK2 and the detection signal S20, the multiplexer 51 receives the signal from the inverter 54 and the clock CK1 from GVCO 21. The operation of the GVCO 22 during the periods T1 to T3 is as previously described.

Table 1 shows the state of the select signals Sel50 to Sel53 and the synchronizing signal Sync during the periods T1 to T3. A logic level "1" represents a high voltage level, a logic level "0" represents a low voltage level, and "X" is referred to as a don't care state.

TABLE 1

|  | first mode M1 | second mode M2 | Third mode M3 |
|---|---|---|---|
| select signal Sel52 | 1 | 0 | 0 |
| select signal Sel53 | 1 | 0 | 0 |
| synchronizing signal Syn | X | 0 | 1 |
| select signal Sel50 | Detection signal S21 | 0 | 0 |
| select signal Sel51 | 0 | 0 | 1 |

In same embodiments, when each GVCO operates in the modes M1 and M3, the select signals Sel52 and Sel53 have the same voltage level. In practice, the states of the select signals Sel50 to Sel53 and the synchronizing signal Sync can be determined according to system requirements, as long as the result of the operation of each GVCO is the same as described.

In some embodiments, each of two GVCOs operates in clock/data recovery mode, phase-locked mode, and synchronization mode alternately. The oscillating frequency of each GVCO can be adjusted precisely, avoiding erroneous estimation of a phase of a data signal.

While the invention has been described in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A clock and data recovery circuit receiving an input signal and outputting an output signal in phase with the input signal, comprising:

a phase detection circuit estimating a significant transition of the input signal and outputting a first detection signal;

a first oscillator receiving the first detection signal and outputting a first clock, wherein the first oscillator operates in a first mode during a first period and sequentially in second and synchronization modes during a second period;

a second oscillator receiving the first detection signal and outputting a second clock, wherein the second oscillator operates sequentially in the second and synchronization modes during the first period and operates in the first mode during the second period; and a flip-flop receiving the input signal and outputting the output signal according to the first and second clocks respectively during the first and second periods, wherein the first oscillator comprises:

a first multiplexer receiving the first clock and the first detection signal and controlled by a first select signal;

a first delay unit coupled to an output terminal of the first multiplexer;

a second multiplexer receiving the second clock and a signal output from the first delay unit and controlled by a second select signal; and a second delay unit coupled to an output terminal of the second multiplexer and outputting the first clock, wherein when the first oscillator operates in the first mode, the first multiplexer transmits the first clock to the first delay unit according to the first select signal at a first level or transmits the first detection signal to the first delay unit according to the first select signal at a second level; and wherein when the first oscillator operates in the first mode, the second multiplexer transmits the signal output from the first delay unit to the second delay according to the second select signal.

2. The clock and data recovery circuit as claimed in claim 1, wherein during a third period, the first oscillator operates in the first mode.

3. The clock and data recovery circuit as claimed in claim 1, wherein during a third period, the second oscillator operates sequentially in the second and synchronization modes.

4. The clock and data recovery circuit as claimed in claim 1, wherein during the first period, the first oscillator operates in the first mode and outputs the first clock to control the flip-flop to output the output signal; and wherein during the first period, the second oscillator operates in the second mode to adjust a frequency of the second clock and then operates in the synchronization mode to synchronize the second clock with the first clock.

5. The clock and data recovery circuit as claimed in claim 1, wherein during the second period, the first oscillator operates in the second mode to adjust a frequency of the first clock and then operates in the synchronization mode to synchronize the first clock with the second clock; and wherein during the second period, the second oscillator operates in the first mode and outputs the second clock to control the flip-flop to output the output signal.

6. The clock and data recovery circuit as claimed in claim 1 further comprising a frequency control circuit receiving a reference clock;

wherein during the first period, the frequency control circuit receives the second clock and generates a second control voltage to the second oscillator to adjust the frequency of the second clock; and wherein during the second period, the frequency control circuit receives the first clock and generates a first control voltage to the first oscillator to adjust the frequency of the first clock.

7. The clock and data recovery circuit as claimed in claim 6 further comprising a multiplexer receiving the first and second clocks and controlled by a first select signal;

wherein during the first period, the multiplexer outputs the first clock to the flip-flop and the second clock to the frequency control circuit according to the first select signal; and wherein during the second period, the multiplexer outputs the second clock to the flip-flop and the first clock to the frequency control circuit according to the first select signal.

8. The clock and data recovery circuit as claimed in claim 6, wherein the frequency control comprises:

a frequency divider dividing the frequency of the second clock during the first period and the frequency of the first clock during the second period;

a phase/frequency detector receiving the reference clock, outputting a control signal according to the difference between the reference clock and the second clock during the first period, and outputting the control signal according to the difference between the reference clock and the first clock during the second period;

a charge pump receiving the control signal, changing the second control voltage according to the control signal during the first period, and changing the first control voltage according to the control signal during the second period; and a first filter providing the first control voltage;

a second filter providing the second control voltage.

9. The clock and data recovery circuit as claimed in claim 8, wherein the frequency control circuit further comprises a de-multiplexer controlled by a first select signal, connecting the charge pump to the second filter during the first period, and connecting the charge pump to the first filter during the second period.

10. The clock and data recovery circuit as claimed in claim 1, wherein when the first oscillator operates in the second mode, the first multiplexer transmits the first clock to the first delay unit according to the first select signal; and wherein when the first oscillator operates in the second mode, the second multiplexer transmits the signal output from the first delay unit to the second delay according to the second select signal.

11. The clock and data recovery circuit as claimed in claim 10, wherein when the first oscillator operates in the synchronization mode, the first multiplexer transmits the first clock to the first delay unit according to the first select signal; and wherein when the first oscillator operates in the synchronization mode, the second multiplexer transmits the second clock to the second delay according to the second select signal.

12. The clock and data recovery circuit as claimed in claim 1 wherein the second oscillator comprises:

a third multiplexer receiving the second clock and the first detection signal and controlled by a third select signal;

a third delay unit coupled to an output terminal of the third multiplexer;

a fourth multiplexer receiving the first clock and a signal output from the third delay unit and controlled by a fourth select signal; and a fourth delay unit coupled to an output terminal of the fourth multiplexer and outputting the second clock.

13. The clock and data recovery circuit as claimed in claim 12, wherein when the second oscillator operates in the first mode, the third multiplexer transmits the second clock to the third delay unit according to the third select signal at a first level or transmits the first detection signal to the third delay unit according to the third select signal at a second level; and wherein when the second oscillator operates in the first mode, the fourth multiplexer transmits the signal output from the third delay unit to the fourth delay according to the fourth select signal.

14. The clock and data recovery circuit as claimed in claim 12, wherein when the second oscillator operates in the second mode, the third multiplexer transmits the second clock to the third delay unit according to the third select signal; and wherein when the second oscillator operates in the second mode, the fourth multiplexer transmits the signal output from the third delay unit to the fourth delay according to the fourth select signal.

15. The clock and data recovery circuit as claimed in claim 12, wherein when the second oscillator operates in the synchronization mode, the third multiplexer transmits the second clock to the third delay unit according to the third select signal; and wherein when the second oscillator operates in the synchronization mode, the fourth multiplexer transmits the first clock to the fourth delay according to the fourth select signal.

16. The clock and data recovery circuit as claimed in claim 12, wherein the phase detector further outputs a second detection signal delayed from the first detection signal.

17. The clock and data recovery circuit as claimed in claim 16, wherein the first oscillator further comprises:
- a fifth multiplexer receiving the second detection signal and a first low level signal and controlled by a fifth select signal; and
- a sixth multiplexer receiving a synchronizing signal and a second low level signal and controlled by a sixth select signal.

18. The clock and data recovery circuit as claimed in claim 17,
- wherein when the first oscillator operates in the first mode, the fifth multiplexer selects the second detection signal to be the first select signal; and
- wherein when the first oscillator operates in the first mode, the sixth multiplexer selects the second low level signal to be the second select signal according to the sixth select signal.

19. The clock and data recovery circuit as claimed in claim 17,
- wherein when the first oscillator operates in the second or synchronization mode, the fifth multiplexer selects the first low level signal to be the first select signal according to the fifth select signal; and
- wherein when the first oscillator operates in the second or synchronization mode, the sixth multiplexer selects synchronizing signal to be the second select signal according to the sixth select signal.

20. The clock and data recovery circuit as claimed in claim 19, wherein the synchronizing signal when the first oscillator operates in the second mode and the synchronizing signal when the first oscillator operates in the synchronization mode have different logic levels.

21. The clock and data recovery circuit as claimed in claim 17, wherein the first oscillator further comprises:
- a seventh multiplexer receiving the second detection signal and the first low level signal and controlled by a seventh select signal; and
- an eighth multiplexer receiving the synchronizing signal and the second low level signal and controlled by an eighth select signal.

22. The clock and data recovery circuit as claimed in claim 21,
- wherein when the second oscillator operates in the first mode, the seventh multiplexer selects the second detection signal to be the seventh select signal; and
- wherein when the second oscillator operates in the first mode, the eighth multiplexer selects the second low level signal to be the fourth select signal according to the eighth select signal.

23. The clock and data recovery circuit as claimed in claim 21,
- wherein when the second oscillator operates in the second or synchronization mode, the seventh multiplexer selects the first low level signal to be the third select signal according to the seventh select signal; and
- wherein when the second oscillator operates in the second or synchronization mode, the eighth multiplexer selects synchronizing signal to be the fourth select signal according to the eighth select signal.

24. The clock and data recovery circuit as claimed in claim 23, wherein the synchronizing signal when the second oscillator operates in the second mode and the synchronizing signal when the second oscillator operates in the synchronization mode have different logic levels.

* * * * *